United States Patent [19]
Takahashi

[11] Patent Number: 5,982,689
[45] Date of Patent: Nov. 9, 1999

[54] AMPLIFIER CIRCUIT OF LATCH TYPE WHICH IS USED FOR SEMICONDUCTOR MEMORY DEVICE

[75] Inventor: Hiroyuki Takahashi, Tokyo, Japan

[73] Assignee: NEC Corporation, Tokyo, Japan

[21] Appl. No.: 08/962,659

[22] Filed: Nov. 3, 1997

[30] Foreign Application Priority Data

Nov. 1, 1996 [JP] Japan .................................... 8-291869

[51] Int. Cl.⁶ .................................................... G11C 7/00
[52] U.S. Cl. .......................... 365/205; 365/208; 365/203; 327/51
[58] Field of Search .................................. 365/205, 208, 365/207, 203; 327/51, 57

[56] References Cited

U.S. PATENT DOCUMENTS

| | | | |
|---|---|---|---|
| 5,325,335 | 6/1994 | Ang et al. ............................ | 365/205 X |
| 5,488,548 | 1/1996 | Vo et al. .................................. | 365/203 |
| 5,574,681 | 11/1996 | Foss et al. ........................... | 365/205 X |
| 5,748,556 | 5/1998 | Iyengar ................................ | 365/208 X |

FOREIGN PATENT DOCUMENTS 6-84376   3/1994   Japan .

OTHER PUBLICATIONS

Katsuro Sasaki et al., "A 9–ns 1–Mbit CMOS SRAM", *IEEE Journal of Solid–State Circuits,* vol. 24, No. 5, Oct. 1989, pp. 1219–1225.

*Primary Examiner*—Huan Hoang
*Attorney, Agent, or Firm*—Sughrue, Mion, Zinn, Macpeak & Seas, PLLC

[57] ABSTRACT

An amplifier circuit of the present invention comprises first and second signal lines transferred data from a memory cell, first and second nodes, a latch circuit coupled between the first and second nodes, a first MOS transistor coupled between the first signal line and the first node, and a second MOS transistor coupled between the second signal line and the second node.

25 Claims, 9 Drawing Sheets

AMPLIFIER CIRCUIT OF LATCH TYPE WHICH IS USED FOR SEMICONDUCTOR MEMORY DEVICE

BACK OF THE INVENTION

The present invention relates to an amplifier circuit and more particularly, to a difference potential amplifier circuit for amplifying a small amplitude voltage signal for a semiconductor memory device.

A sense amplifier circuit used for a semiconductor device exists in a variety of manners depending on the object thereof, but an example of a static random access memory (SRAM) is shown here as a sense amplifier in which importance is attached to high-speed performance. As a sense amplifier circuit of an SRAM, there are also a static type in which the output is generated while amplifying it steadily in accordance with an amplitude of the input and a latch type in which the output voltage variation is fed back to the amplification operation from the input amplitude.

FIG. 11 shows a conventional circuit of a static type. Memory cells are arranged at points of intersection of the matrix of a plurality of word line and digit line pairs (not shown). A switch circuit for transmitting only the signals selected out of these plurality of digit lines to bus lines B and BB is provided for every digit line pair (not shown). The signals of these bus lines B and BB are inputted to a first sense amplifier 1st SA. The outputs C and CB of the amplifier 1st SA are inputted to a second sense amplifier 2nd SA. The outputs S and SB of the amplifier 2nd SA become sense amplifier outputs. In the sense amplifier 1st SA, n-type MOS transistors (nMOS) M101 and M102 of differential amplifier connection with the bus lines B and BB as gate inputs and a source terminal in common are located, and respective drain terminals are connected to the outputs C and CB. P-type MOS transistors (pMOS) M104 and M105 in an on-state are provided between the respective drains of the nMOSs.M101 and M102 and the highest power supply potential (VCC). An nMOS.M103 is connected between the common source terminal of the nMOSs.M101 and M102 and the lowest power supply voltage (GND), and a signal SE1 is inputted to the gate of the nMOS.M103 to activate the differential amplifier. The sense amplifier 2nd SA is a sense amplifier is connected to the outputs C and CB as inputs thereof. The type thereof are various such as a differential amplifier type similar to the sense amplifier 1st SA, a current mirror type or the like, and the sense amplifier 2nd SA is structured further of these types connected at a plurality of stages. The signal SE2 activates the sense amplifier 2nd SA. The signal amplified by this amplifier 2nd SA is transferred to an output buffer circuit (not shown) and outputted as read out data.

Next, the operation of this circuit will be explained. Since the selected memory cell draws a current from either one of the digit line pair, the potential of one digit line falls with discharge with this current and potential difference is produced between the digit line pair. This potential difference is transmitted to the bus lines B and BB through a switch element selected by a decode signal. The amplitude of the potential of the digit line is transmitted to the bus lines a and BB. It takes a long time to widen the potential difference since a digit line has large capacity. The slow disparity of potential between bus lines B and BB enters into the gates of nMOSs.M101 and M102 of the sense amplifier 1st SA. The differential amplifier 1st SA is turned ON by a signal SE1 at a point of time then the potential difference between the bus lines B and BB is fully extended. Even when a difference in ability of the transistors M101 and M102 is taken into consideration, the potential difference of approximately 100 mV is required in order to perform stable operation. The gate voltage difference of the nMOSs.M101 and M102 produces the difference of the transistor ability thereof, thereby, produces the difference of the drain currents thereof. Therefore, the difference of the voltage drop based on pMOSs.M104 and M105 as loads is produced. This difference potential shows the voltage amplification quantity of the outputs C and CB. The sense amplifier 1st SA is not brought into a state of turning either one of nMOSs.M101 and M102 OFF. That is why although an nMOS on the low side is brought to an OFF state when the signals of the bus lines B and BB show a large amplitude, the read-out speed is delayed by a large margin when a signal SE1 is delayed to this point of time. Therefore, the outputs C and CB remain in an amplitude up to approximately 0.2 to 1 V. The signals S and SB have an amplitude (CMOS level) near the power supply potential by further amplifying the signal in the sense amplifier 2nd SA. It does not matter whether the sense amplifier 2nd SA is activated after the voltage difference between the outputs C and CB is widened to an amplitude sufficient for the sense amplifier 2nd SA to operate or the sense amplifier 2nd SA is turned ON simultaneously with the signal SE1.

FIG. 12 shows a second conventional example of the latch type. Bus lines B and BB transferred data from a memory cell in a similar manner as the first conventional example are connected to the inputs of pMOS.M111, nMOS.M113 and pMOS.M112, nMOS.M114 that form two inverters, and the outputs of these inverters are connected to reverse bus lines B and BB, respectively. An nMOS.M116 is inserted between a common source of nMOSs.M113 and M114 and a ground source GND and is inputted a sense amplifier activation signal SE. A pMOS.M115 is inserted between a common source of pMOSs.M111 and M112 and the power source VCC and inputted an inverting signal of the sense amplifier activation signal SE. pMOSs.M117 and M118 are in existence between the bus lines B and BB and VCC to precharge the bus lines B and BB at the same potential when the sense amplifier is deactivated. A pMOS.M119 is inserted between the bus lines B and BB. A precharging signal PB is inputted to the gates of pMOS M117, M118, and M119. The bus lines B and BB feed input signals, but function also as output signals S and SB as they are when the sense amplifier is activated The operation will be explained. The pMOSs.M117 to M119 perform an equalizing operation for bringing the bus lines B and BB to the same potential and a precharging operation for fixing them at VCC potential. It is required to reset or equalize the bus lines B and BB completely in a state before the operations are discontinued. This is because of such a reason that an operational margin of a sense amplifier for a signal which is being read out is reduced when offset potential by previous readout data remains. The precharging signal PB is brought to a high level so as to turn pMOSs.M117 to M119 OFF. When the word line is selected and potential difference starts to be generated between digit lines similarly to the first conventional example, potential difference appears between these bus lines B and BB. The sense amplifier activation signal SE is brought to a high level so as to turn the pMOS.M115 and the nMOS.M116 ON at a point of time when the signals of the bus lines B and BB are extended to such an extent that the sense amplifier can be operated (approximately 100 mV). A CMOS inverter by M111 and M113 and a CMOS inverter by M112 and M114 are turned ON so as to perform flip-flop operation. Although pMOSs.M111 and M112 are not turned ON since the input potentials of these inverters are high in the vicinity of VCC, the potential difference of the gate voltage produces difference in ON performance of M113 and 114 since respective nMOSs.M113 and M114 are in an ON-state, whereby to draw a small current from the high side and a large current from the low side in the bus lines B and BB. The potentials of the bus lines B and BB expand the potential difference while falling, and, when the potential falls to such an extent that pMOSs.M111 and M112 can be turned ON, feedback by pMOSs.M111 and M112 starts to be applied and the bus line on the high side is raised to VCC. Therefore, the potential is finally brought to such a level that can be used as the outputs S and SB which is at the output level capable of logical operation. This is because of such a reason that the first data of the amplification operation are the potential difference between the bus lines B and BB, but the operation continuing amplification thereafter is performed by that the sense amplifier itself feeds back the output signal to the input, to put it shortly, latch operation is being generated.

An example in which the first conventional example and the second conventional example are combined with each other also exists, and optimization is made adapting to the product design. Further, these circuit examples are described in, for example, Japanese Patent Laid-Open No. 6-84376 (although attention is paid to a circuit system for optimization of timing for turning the sense amplifier ON in the present invention, the basic structure of the sense amplifier itself is aimed at.) and IEEE Journal of Solid-state Circuits, Vol. 24, No. 5, Oct., 1989, p.1219–1224.

In order to activate the sense amplifier and output correct data at a high speed in the circuit of the above-mentioned conventional example, a characteristic dispersion quantity (unbalance) existing between transistors of a pair forming a differential amplifier becomes an issue.

In the first conventional example, when the amplitude of the sense amplifier input is small, correct output data are negated if unbalance which is partial to reverse data exists in the nMOS or the load pMOS of the is differential amplifier. In this case, since a sufficient amplification signal is not outputted at the output of the sense amplifier 1st SA, correct data are neither outputted as the whole sense amplifier. When the input amplitude to the sense amplifier becomes larger with the lapse of time, the unbalance quantity is negated sufficiently and correct data are outputted, but the readout speed is delayed by the time portion until then. The influence by this unbalance also exists in the amplification circuit in the sense amplifier 2nd SA and thereafter, but the influence by the unbalance of the sense amplifier at the first stage becomes dominant as the whole sense amplifier circuit because the sense amplifier at the next stage also amplifies the unbalance of the sense amplifier at the previous stage, too. Since the output signal is never fed back to the input in this conventional example, the readout speed is determined depending on the time that the input amplitude is increased and a relative size by the unbalance quantity. In a work, although speed delay is produced, it does not occur that correct data are not outputted. It determines the readout speed that the gate voltage difference of nMOSs.M101 and M102 forming the differential amplifier of the sense amplifier 1st SA negates the unbalance between this nMOS itself and pair transistors of pMOSs.M104 and M105 that are loads.

In the second conventional example, correct data are outputted by activating the sense amplifier at the point of time when the input amplitude becomes larger to such an extent that the unbalance quantity of the sense amplifier is overcome. If the unbalance quantity surpasses the input amplitude, a phenomenon of starting to output wrong data occurs, and furthermore, feedback from the output which is the feature of the latch system is applied and wrong data are continued to be amplified. Thus, since correct data disappear completely so as to cause malfunctions once wrong data enter into a feedback loop. Therefore, it is required to adjust the activation timing of the sense amplifier so that the foregoing will not occur. Since the potentials of the bus lines B and BB are high in the vicinity of VCC, only the transistor on the nMOS side of the latch circuit can be turned ON in an activated initial state, and an nMOS differential amplifier system is produced similarly to the first conventional example. In a word, the fact that the gate voltage difference negates the unbalance of the nMOS itself determines the timing of sense amplifier activation.

What can be applied in either example is that correct data cannot be read out until the gate voltage difference of the nMOS differential amplifier forming the sense amplifier at the first stage surpasses the unbalance quantity of the pair transistors forming the sense amplifier itself, which causes one of primary factors of obstructing achievement of a high speed. Furthermore, since the speed dispersion due to this delay portion is large, it is the present state that a sense amplifier system by a plurality of stages is adopted, and the insufficient amplification portion at the first stage is compensated at the second stage and thereafter. Therefore, a problem that the area of the sense amplifier is increased is produced. This becomes more and more serious problem in a semiconductor memory today in which multi-bit formation is going on.

SUMMARY OF THE INVENTION

It is an object of the present invention is to provide an amplifier circuit having an improved amplification effects and resistant to unbalance between pair transistors and operating at a high speed, An amplifier circuit of the present invention comprises first and second signal lines transferred data from a memory cell, first and second nodes, a latch circuit coupled between the first and second nodes, a first MOS transistor coupled between the first signal line and the first node, and a second MOS transistor coupled between the second signal line and the second node.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
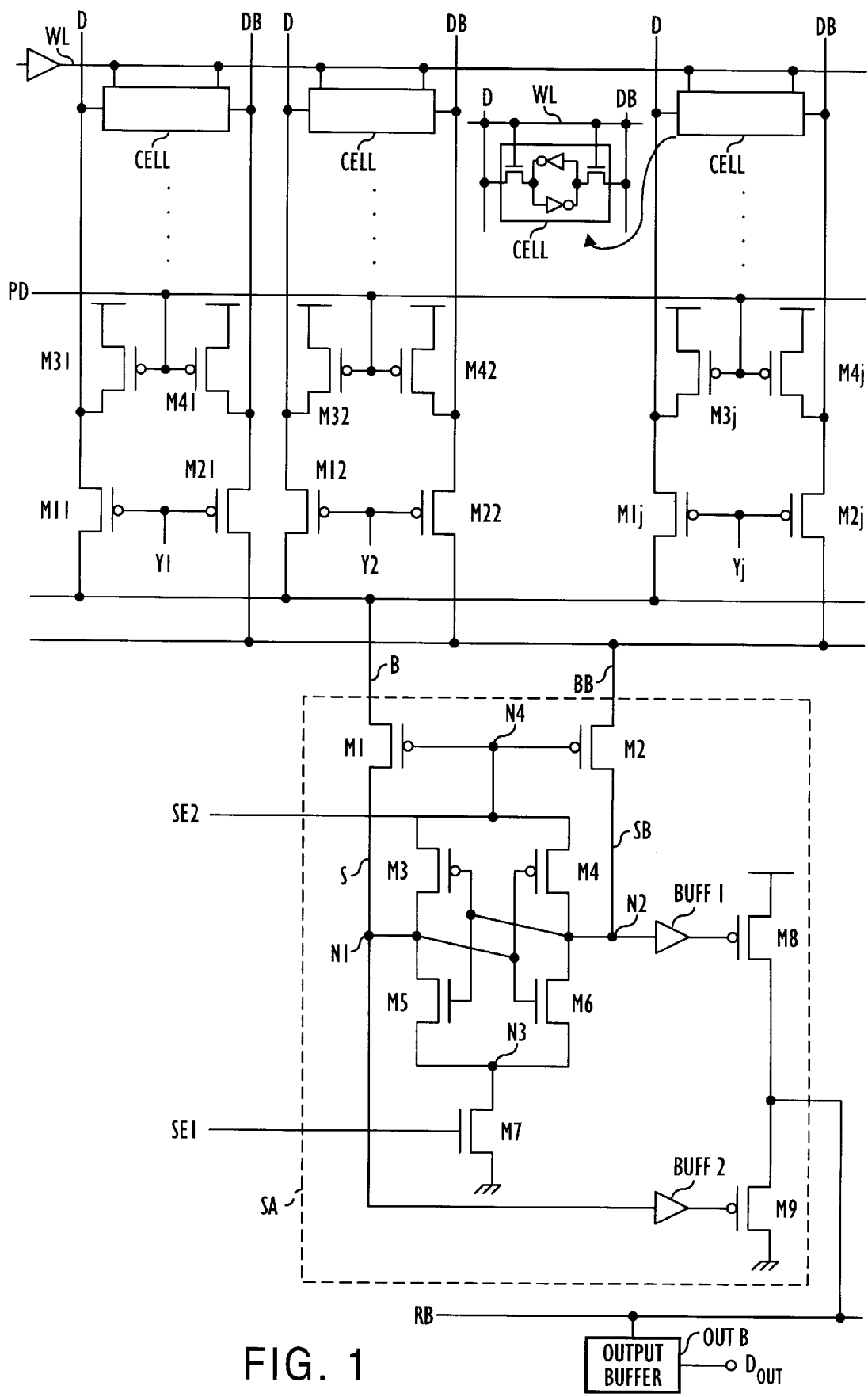
FIG. 1 is a circuit diagram of a sense amplifier and a memory circuit showing a first embodiment of the present invention.

Referring now to FIG. 1, the description will be made on a sense amplifier and memory blocks according to a first embodiment of the present invention.

Memory cells are arranged at points of intersection in a matrix of a plurality of word lines WL and digit line pairs D and DB. pMOSs.M11 and M21, M12 and M22, . . . , M1j and M2j that are switch circuits for transmitting only signals selected from these plurality of digit lines D and DB to bus lines B and BB are provided at every digit line pairs D and DB. Selecting signals Y1, Y2, . . . , Yj are inputted to the gates of these pMOSs.M11 and M21, M12 and M12, . . . , M1j and M2j, respectively. pMOSs.M31 and M41, M32 and M42, . . . , M3j and M4j that are precharging transistors for fixing the potential are also connected to respective digit lines D and DB, and a control signal PD is inputted to the common gates thereof. The signals of these bus lines B and BB are inputted to a sense amplifier SA. The signals of the bus lines B and BB are inputted to the sources of pMOSs.M1 and M2, respectively, Drains of the pMOS M1 and M2 is connected to signal lines S and SB respectively. The signals of the signal lines S and SB are inputted to a CMOS inverter composed of a pMOS.M4 and an nMOS.M6 and a CMOS inverter composed of a pMOS.M3 and an nMOS.M5, respectively. The drains of the pMOS M3 and the nMOS M5 are connected to a node N1. The drains of the pMOS M4 and the nMOS M6 are connected to a node N2. A latch structure in which the outputs of the CMOS inverters are feedback-connected to the signal lines S and SB at the same time is formed. An nMOS.M7 is connected between a common source terminal or a node N3 of nMOSs.M5 and M6 and the lowest power supply potential (GND), and a control signal SE1 is inputted to the gate thereof. Another control signal SE2 is connected directly to the gates of pMOSs.M1 and M2 and the common source terminal or a node N4 of pMOSs.M3 and M4. The signal line S is connected to a gate of a pulldown driving nMOS.M9 as a buffer circuit through an inverter BUFF2, and the signal line SB is connected to a gate of a pullup driving pMOS.M8 also as a buffer circuit through a BUFF 1 at the stage of inverter 2. A pMOS.M8 and an nMOS. M9 are inverter-connected with each other, and a read bus line RB is connected to the drain output. A signal selected from a plurality of sense amplifiers SA connected to the read bus line RB is inputted to an output buffer circuit OUTB through the read bus line RB, and outputted finally from an output terminal Dout as readout information. Here, the pMOSs.M1 and M2 form a first MOS transistor pair, the nMOSs.M5 and M6 form a second MOS transistor pair, and the pMOSs.M3 and M4 form a third MOS transistor pair.

Figure 2:
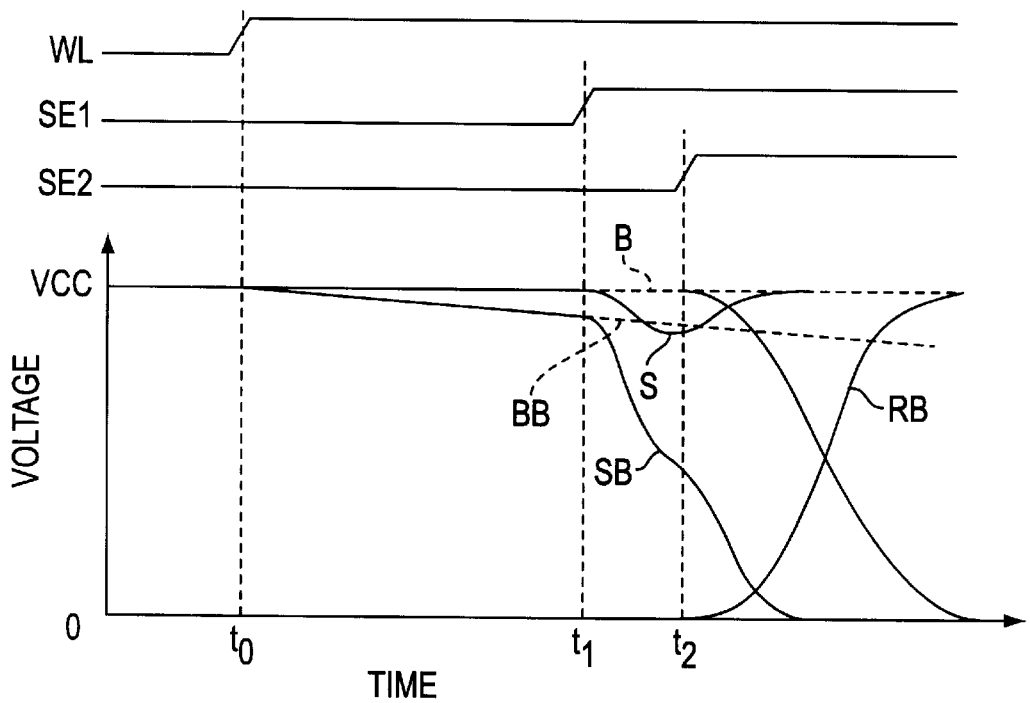
FIG. 2 is an operation voltage waveform diagram of a sense amplifier in the first embodiment and a conventional example.

Next, the operation of this circuit will be explained with reference to FIG. 2 showing potential waveforms. Since the memory cell CELL selected by a word line WL draws a current from either one of digit lines D and DB, the potential of one digit line drops by discharge with this current, and a potential difference is produced between digit lines forming a pair. The data of "0" and "1" become distinct with the phase of this difference potential, but several hundreds to several thousands of memory cells are connected to the digit line, and, since a large load capacity is attached even when it is in an OFF state. Therefore, the time constant when the difference potential falls is very large, thus causing gentle disparity of potential. Since it is required to fix the digit lines D and DB to the same potential before the cell data readout, the control signal PD is at a low level and pMOSs.M31 and M41 and in an ON-state. The digit lines D and DB are precharged to the highest power supply potential (VCC) and the control signal PD is brought to a high level when the word line WL is selected, and these precharging transistors are turned to OFF, When only the switch circuit selected among selecting signals Y1 to Yj is turned ON, for example, when the selecting signal Y1 is selected and only pMOSs.M11 and M21 are turned ON, the difference potential information of the digit lines D and DB is transmitted to the bus lines B and B3. Switch transistors M12 to M1J and M22 to M2j that are in an OFF state are connected to the bus lines B and BB. However, since the load capacity is overwhelmingly small as compared with the digit lines D and DB, the potential change of the digit lines D and DB are transmitted to the bus lines B and BB with almost no delay and are inputted to the sense amplifier SA. Since both the control signals SE1 and SE2 are at a low level during the time (t0 to t1) when voltages of the bus lines B and BB have not fully extended as yet, the sense amplifier SA is not activated, but only the pMOSs.M1 and M2 are in an ON-state The signals of the bus lines B and BB are transmitted to the signal lines S and SB as they are through these transistors M1 and M2, and the potential difference is widened slowly in accordance with the digit line time constant. At a point of time (t1) when a sufficient value of approximately 100 mV for example is reached as the potential difference inputted to the sense amplifier SA, only the control signal SE1 is brought to a high level first. Then, an nMOS.M7 is turned ON, and the differential amplifier circuit by the nMOSs.M5 and M6 is connected to the signal lines S and SB. Since the signal lines S and SB are inputted to the gates of the nMOSs.M5 and M6 at a point of time t1, this input voltage difference is given between the nMOSs.M5 and M6 as the gate voltage difference, thus producing current capability difference. Further, since the pMOSs.M1 and M2 are also in an ON-state, the gate voltage difference is received with the potential difference between the bus lines B and BB, thus producing current capability difference. For example, when the bus line B is high and the bus line BB is low as shown in the figure, the current capability of the pMOS.M1 and the nMOS.M6 becomes high, and that of the pMOS.M2 and the nMOS.M5 becomes low. Since there is a difference between the source potentials of the pMOS.M1 and the pMOS.M2 at this time, the threshold voltage or value of the pMOS.M2 changes higher than the threshold value of the pMOS.M1 by backbias effects, the impedance of the pMOS M1 changes lower than the impedance of the pMOS M2, the current ability of the pMOS M1 becomes higher than that of the PMOS M2 and thereby, the ability difference between these pMOSs.M1 and M2 becomes more conspicuous. The potential of the signal lines S and SB falls by this discharge current bus, but, since the potential of the signal line S changes gently and the potential of the signal line SB changes rapidly, the potential difference between two points is expanded, It is clear that the effects of amplification have a large gain against that the circuit in a conventional example has performed initial amplification with only the gate voltage difference of the nMOS. At a point of time t2 when the potential difference between the signal lines S and SB has been widened sufficiently (0.3 to 0.5 V), and the voltage of the signal line SB on the low side has become sufficiently lower (VCC−1 V or below) than the threshold voltage of the pMOS at the same tire, the signal line SE2 is brought to a high level Then, the transfer elements M1 and M2 are turned OFF and differential amplifier circuits (pMOSs.M3 and M4) of the pMOS are turned ON, but, since the signals S and SB having sufficient potential difference are inputted to this latch circuit at the gate input, the pMOS.M3 is turned ON sufficiently, and the pMOS.M4 is brought to an almost OFF state. Thus, the signal line S is opened to VCC and the signal line SB is opened to GND rapidly, thus completing the amplification operation. Since the signal lines S and SB both show high potential in the vicinity of VCC before the sense amplifier SA is activated, the output of the buffer BUFF1 at the next stage becomes high, the output of the buffer BUFF2 becomes low, and PB driving transistors M8 and M9 are turned OFF, and the output of the sense amplifier SA was in a high impedance state. Since one of the signal lines S and SB becomes low after the sense amplifier SA is activated, a pMOS.M8 or an nMOS.M9 is turned ON in accordance therewith, and outputs data to the read bus line RB. At this time, since another sense amplifier SA is maintained in a high impedance at the output terminal unless the sense amplifier is activated, the signal of the selected sense amplifier SA is read out through an output buffer OUTB.

The points for achieving a high speed in the sense amplifier will be explained. It is desirable to first set the impedance of the pMOSs.M1 and M2 high 50 as to increase the falling speed of the signals S and SB, and the impedance of the pMOSs.M1 and M2 is increased by a method of reducing relative dispersion of the pair transistor. For example, it becomes possible to obtain amplification effects without subject to least unbalance quantity of the pMOS itself. Naturally, since the delay time for transmitting the signal of the bus lines B and BB to the signal lines S and SB in a state before the point of time ti is extended when the transistor capability is too low, it is required to set to appropriate capability. Another point is to make the terminal capacity of the signal lines S and SB as small as possible and to improve disparity of potential between the signal lines S and SB at the point of time t1 and thereafter, which is effective in shortening the time from t1 to t2 and the delay time from t2 until the data are outputted to the read bus line RB. Therefore, the signal lines S and SB are not inputted directly to the gates of large RB driving transistors M8 and M9, but the buffer circuits BUFF1 and BUFF2 are inserted. Further, since these driving transistors M8 and M9 have to realize a high impedance state other than high and low outputs, this tri-state logic circuit is normally put in this buffer circuit as a logic. However, the input capacity is increased by changing the buffer circuit from an inverter to a logic circuit such as a NAND or a NOR, resulting in increase of capacity of the signal lines S and SB. So, in order to avoid the above, the reduction of the terminal capacity of the signal lines S and SB is aimed at by utilizing a logic structure as it is that both signal lines S and SB show a high state at the time of inactivation of the sense amplifier and omitting the logic circuit. Besides, the control signals SE1 and SE2 that are inactivation signals of the sense amplifier SA can be generated easily from an external input clock in the case of a synchronous memory circuit and by an address change detection circuit (ATD) for sensing commencement of readout operation corresponding to address change in the case of an synchronous memory circuit.

Figure 3:
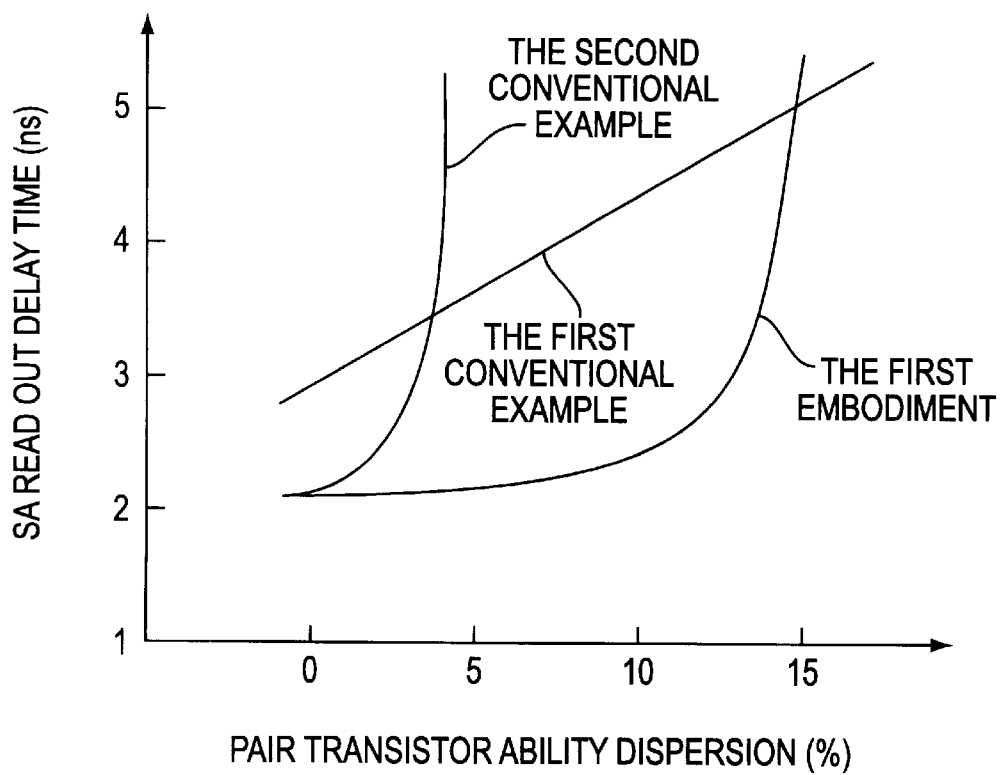
FIG. 3 is a diagram showing the relationship between a read speed and percentage dufferent in transistor capability for a sense amplifier in the first embodiment and a conventional example.

FIG. 3 shows dependency of the delay time from the sense amplifier activation to the read bus output on the ability unbalance quantity between pair transistors forming a sense amplifier in a circuit of the present embodiment and a circuit of a conventional example. Those are the data in which a sense amplifier system in a high-speed SRAM of 1 Mbit is assumed, and the same conditions as the circuit of the first embodiment are assumed for the circuits before and after the sense amplifier in the first and the second conventional examples. Since the number of sense amplifier stages is more in the first conventional example, the speed is slower than another circuit even in a state that no unbalance exists, but the way of delay is constant against increase of unbalance. This is because of such a reason that the delay is determined by the time when the input amplitude negates the unbalance quantity included in the sense amplifier 1st SA, and reflects the characteristic that the input amplitude is increased at an almost constant rate with respect to time. In the second conventional example, high-speed operation is performed with a circuit at one stage by the effects of the latch circuit in an ideal state that no unbalance is included, but, since even the influence exerted by the unbalance is amplified when the unbalance quantity approaches 5%, delay is started rapidly, leading to malfunctions. As against this, in the present embodiment, almost no delay is generated with the unbalance quantity of approximately 10%, but abrupt delay starts to appear when the unbalance quantity reaches approximately 15%. The circuit form being a latch type, the way of starting delay resembles to the second conventional example, but the extent of negating the influence exerted by unbalance becomes wider since the amplifier capability of amplifying the input amplitude is high. When a practical memory circuit is considered, the dispersion quantity by unbalance changes depending on production environment and a layout pattern, which, however, is not at ideal 0%, but a value of approximately several % to 10% is anticipated. Therefore, in the design of present high-speed SRAM, the first conventional example or the combination of the first and the second conventional examples is used in many cases although the speed is slowed down because the variation quantity is too large in the second conventional example, which is dangerous. As against this, since a sufficiently stable scope is adapted in the present embodiment, high-speed operation in which delay by unbalance is scarcely produced can be realized. Further, the present embodiment being one stage of latch types the number of elements is small and it is also effective in reduction of a layout area.

Accordingly, the present invention, transfer elements of the pMOS transistor are provided on this side of the gate input terminals of an nMOS differential amplifier of a latch system in the sense amplifier circuit at the first stage, and these transfer elements are turned OFF after a little while after the nMOS differential amplifier is turned ON. This control signal time difference is made at a point of time when the gate voltage difference of the nMOS which forms the differential amplifier is fully extended. Further, since amplification is completed at one stage by connecting a pMOS in parallel in addition to the nMOS in the differential amplifier form of this latch system, the time difference of the control signal described above also has an object to keep waiting until the input voltage drops to gate voltage or thereunder when the pMOS differential amplifier can be turned ON. Since a gate voltage difference corresponding to the input amplitude is applied with the above to the pMOS transistor which is a transfer element, it is possible to increase the amplification effects of the sense amplifier and to realize circuit operation resistant to unbalance. Further, since it is possible to lighten the capacity of the sense amplifier output terminal by separating this transfer element at an optimum time, amplification operation at one stage as a latch type sense amplifier can also be realized at a high speed.

Figure 4:
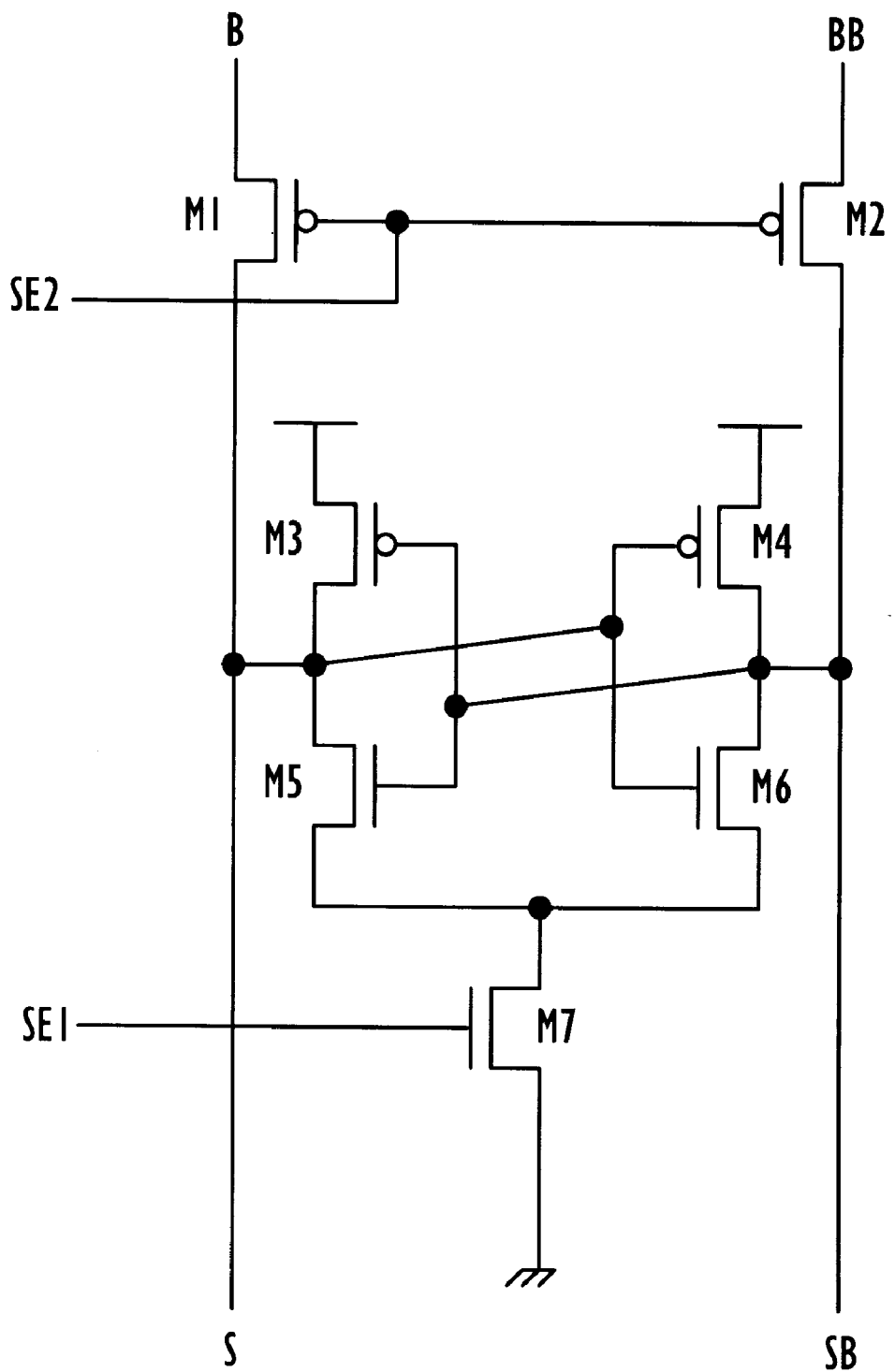
FIG. 4 is a circuit diagram of a sense amplifier according to a second embodiment of the present invention.

FIG. 4 is a circuit diagram or a sense amplifier according to a second embodiment of the present invention. In the present example, those elements that are controlled by the control signal SE2 are only transfer pMOSs of M1 and M2, and sources of pMOSs.M3 and M4 applied with feedback of a latch circuit are fixed to VCC. Since the B and BB potential is VCC when the sense amplifier is an inactive state, these pMOSs.M3 and M4 are in an OFF state. When a readout state is produced, potential difference is generated in the signals of the bus lines B and BB and the signals S and SB at the same potential, butt when the potential is within a range of "VCC-pMOS threshold value" or higher, these pMOSs.M3 and M4 can be maintained in an OFF state. Then, the control signal SE1 becomes high and the sense amplifier is activated and turned ON when the voltage of the signals S and SB is dropped rapidly. Thus, ON/OFF operation similar to the first embodiment becomes possible. By doing so, the load driven by the control signal SE2 is reduced by a large margin, thus producing effects in achievement of a small scale of a control circuit and reduction in current consumption. However, since the timing that the pMOSs.M3 and M4 are turned ON differs depending on the threshold value of the transistor, it is required to carefully confirm whether timing can be obtained properly or not including dispersion in production.

Figure 5:
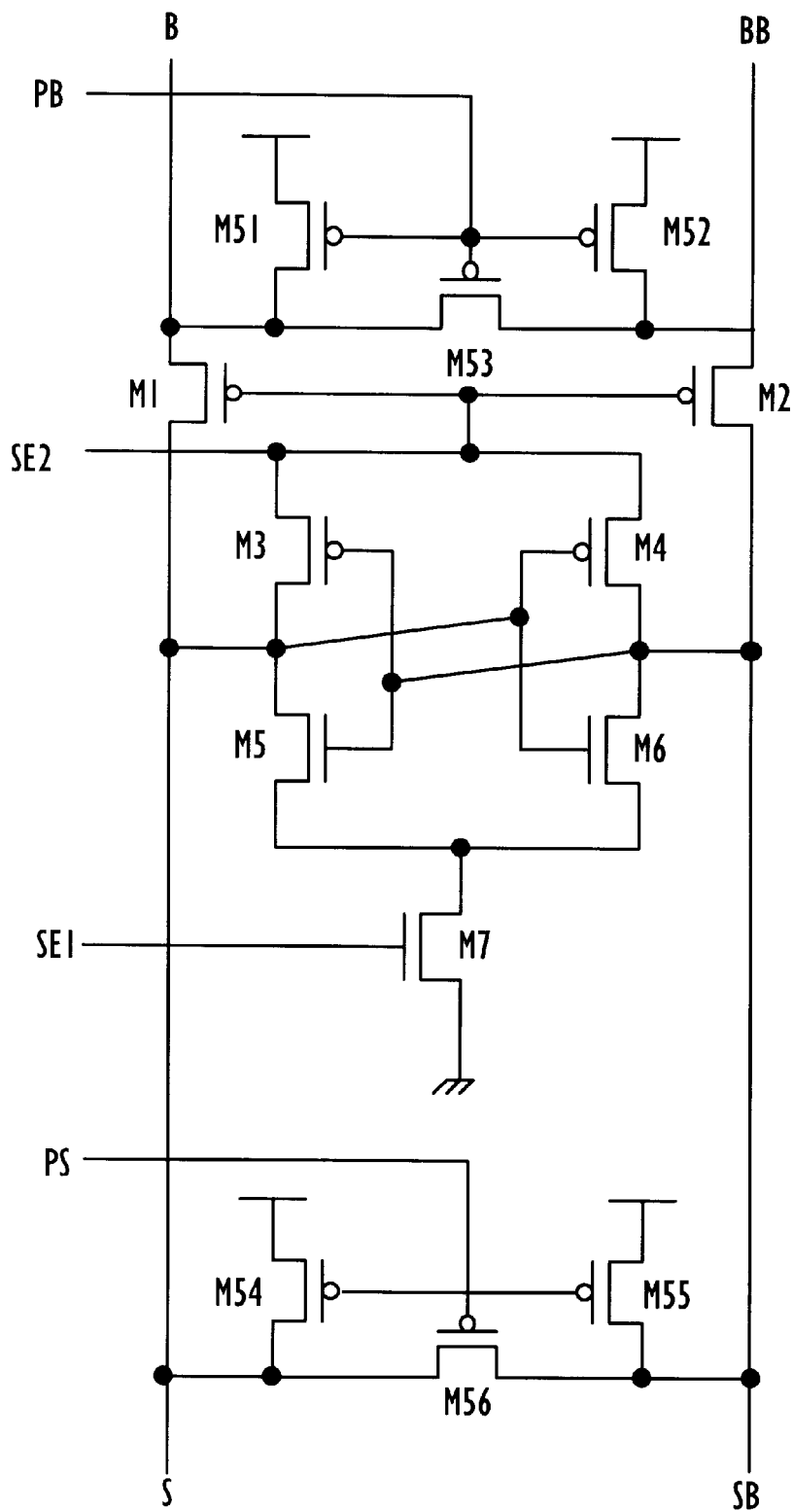
FIG. 5 is a circuit diagram of a sense amplifier according to a third embodiment of the present invention.

FIG. 5 is a circuit diagram of a sense amplifier according to a third embodiment of the present invention. This example shows a case in which a countermeasure when the time required from a sense amplifier is turned OFF until the next readout operation is started that becomes an issue as the operation frequency gets higher, in a word, the recovery time is short has been taken. In order to make the recovery operation of the sense amplifier high in speed, precharging transistors M51 to M53 and equalizing transistors M54 to M56 are installed between the bus lines B and BB and between the signal lines S and SB, respectively, and the gate control signals are set to PB and PS. This is because of such a reason that the transistors M51 to M53 for precharging the bus lines B and BB are similar to those in the circuit of the second conventional example, and it is required to set these bus lines B and BB to the same potential completely before the readout operation is started. Transistors M54 to M56 added in the present example are circuits for precharging the signal lines S and SB. Although node potentials thereof are raised to the potential of the bus lines B and BB, in short, VCC by means of the transfer elements M1 and M2 at the time of recovery, delay is produced because of low transmission capability of the transfer elements from recovery of the bus lines B and BB. Since the capability is narrowed down adapting to the time constant of the digit line in the transfer pMOS, the amplifier capability is lowered when the capability of the transfer-pMOS is increased. Thus, it becomes effective to provide an element for recovery and turn it ON immediately after the sense amplifier becomes inactive.

Figure 6:
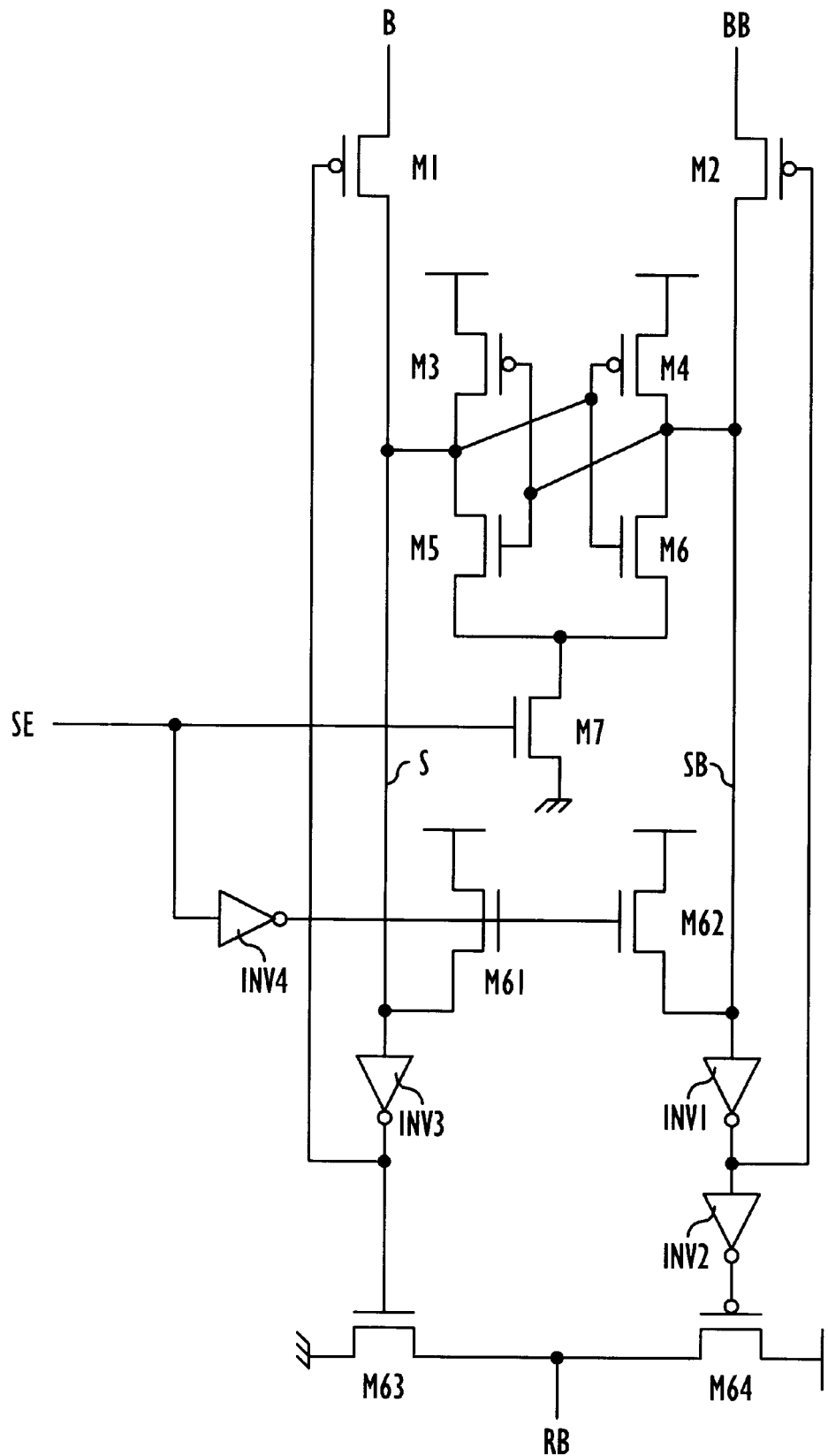
FIG. 6 is a circuit diagram of a sense amplifier according to a fourth embodiment of the present invention.

FIG. 6 is a circuit diagram of a sense amplifier according to a fourth embodiment of the present invention. In the present example, only one line of signal line for controlling the sense amplifier SA has been adopted so as to aim at simplification of the number of wirings or a control signal generating portion. In order to omit the control signal SE2, an output of an inverted buffer INV3 with the signal line S as an input and an output of an inverted buffer INV1 with the signal line SB as an input have been inputted to control gates of the pMOSs.M1 and M2 that are transfer elements, respectively. At the point of time when the control signal becomes high, the sense amplifier is activated and the signal line S or SB is lowered to a low level, transfer elements are turned OFF. In other words, the time difference timing that the signal lines S and SB fall is taken by itself. However, since the transfer element pMOS. M1 and M2 are in an OFF state at the initial stage of recovery, precharging by these pMOSs.M1 and M2 cannot be performed. Accordingly, a circuit for raising the signal lines S and SB strongly first and turning these pMOSs.M1 and M2 ON is required at the time of recovery, and pMOSs.M61 and M62 are provided as precharging elements in which an inverted signal of the control signal SE is inputted to the gate. It is performed by means of transfer elements pMOSs.M1 and M2 to fix the signal lines S and SB to VCC completely, but it is required to raise the signal lines S and SB rapidly higher than the threshold value of the inversion buffer INV3 or INV1 in order to turn these transistors M1 and M2 ON, and an nMOS having high capability has been used. Another reason that an NMOS has been used for precharging is that ON operation cannot be performed even then the gate is at a high potential since the potential of the bus lines B and SB (S and SB) is high in the vicinity of VCC when the readout operation is started, so that no bad influence is exerted upon the input potential difference.

Figure 7:
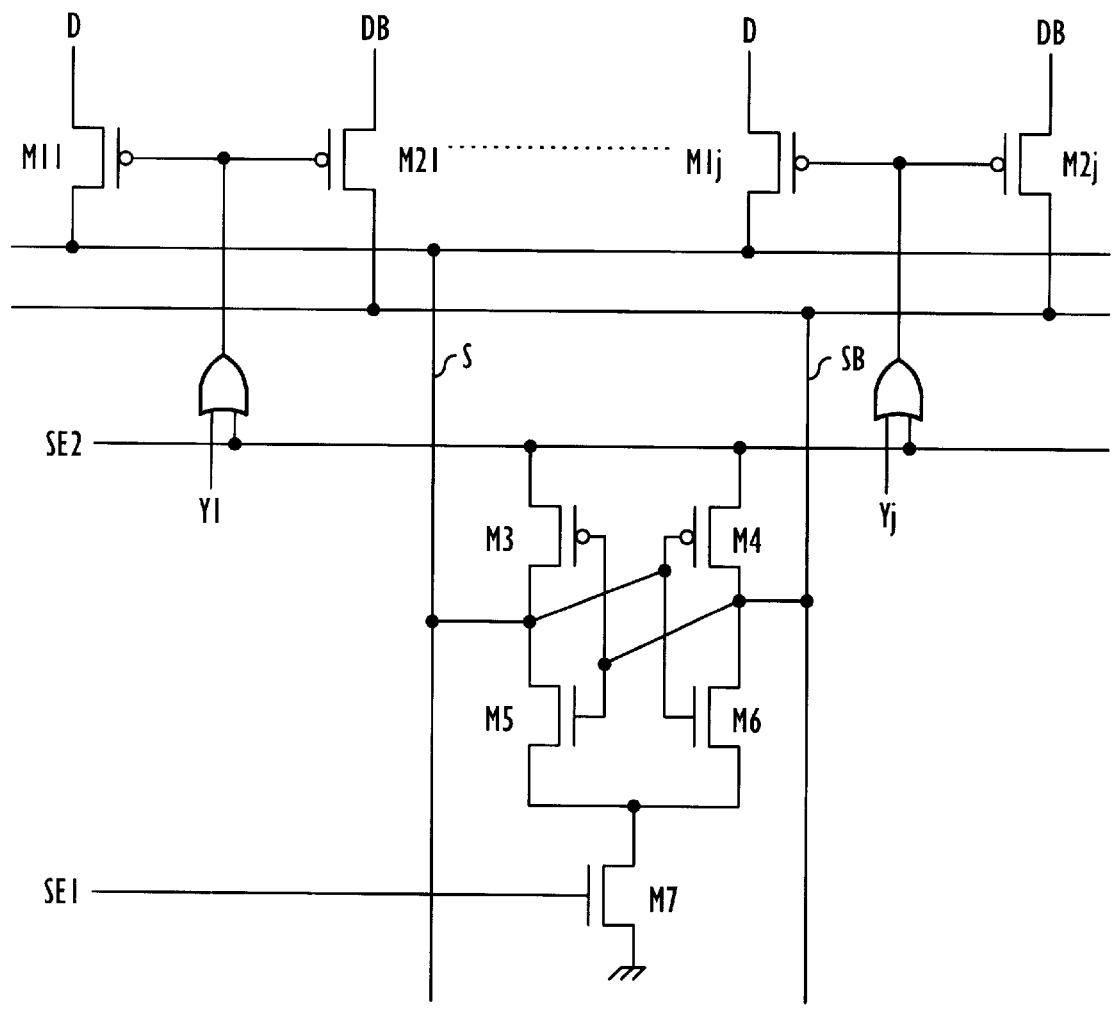
FIG. 7 is a circuit diagram of a sense amplifier according to a fifth embodiment of the present invention.

FIG. 7 is a circuit diagram of a sense amplifier according to a fifth embodiment of the present invention. The present example shows a case that the load capacity of the bus lines B and BB is comparatively light, and a high-speed operation is sufficiently possible even when the bus lines B and BB are used commonly with the signal lines S and SB, and pMOSs.M11, M21, . . . , M1j and M2j for selecting digit line signals by selecting signals Y1 to Yj are made to also serve as a part of pMOSs of the transfer elements. The outputs of an OR logic circuit with digit selecting signals Y1 to Yj and a sense amplifier control signal SE2 as inputs are inputted to the gates of the pMOSs.M11, M21, . . . , M1j and M2j. In the pMOSs.M11 to M2j, it becomes possible to amplify the signal lines S and SB with high capability by performing size adjustment adapting to the amplifier capability determined between nMOS differential amplifiers M5 and M6 similarly to transfer elements. Thereafter, digit selection is all turned OFF at the point of time when the control signal SE2 becomes high, and it becomes possible to amplify the signal lines S and SB to VCC or GND rapidly. Looking from the digit lines D and DB, the switch element up to the sense amplifier output becomes one piece and the load is lightened,but non-selected digit selecting switch elements that are in an OFF state are attached to the signal lines S and SB. Therefore, it is determined which effect is more effective by required product property or layout configuration or the like.

Figure 8:
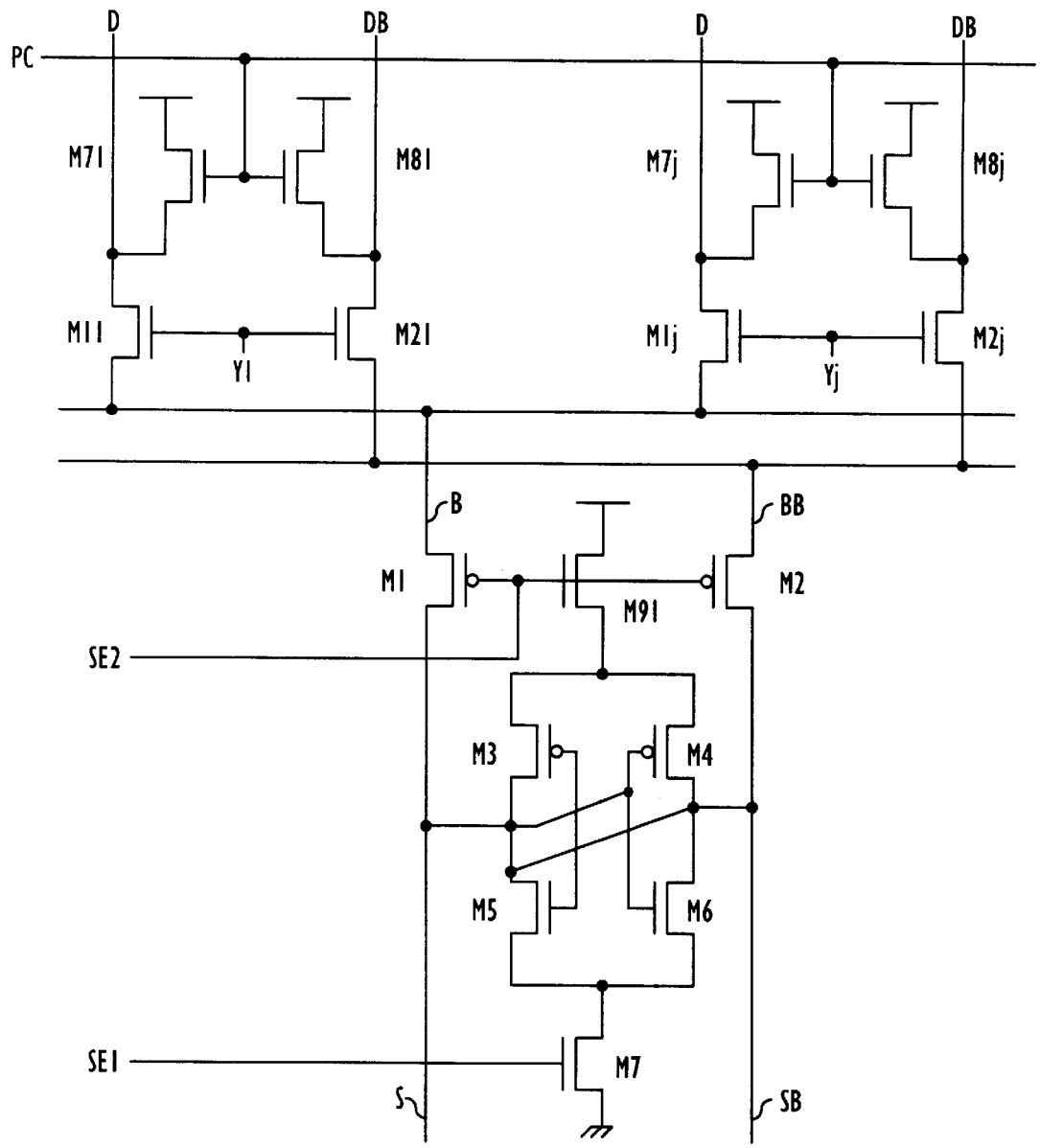
FIG. 8 is a circuit diagram of a sense amplifier according to a sixth embodiment of the present invention.

FIG. 8 is a circuit diagram of a sense amplifier according to a sixth embodiment of the present invention. The present example shows an application to a case of a circuit in which the potential of the digit lines D and DB is set to a VCC-nMOS threshold value by forming the precharging transistors of the digit lines D and DB with nMOSs.M71, M81, . . . , M7j and M8j. It has such an advantage that switch elements or precharging elements which have to be provided in the unit of digit line with nMOS transistors which have high transistor capability and are easily realized in a small area to lower the digit line potential as described above. Since the potential of the digit lines D and DB is low, the digit switch also becomes operable with nMOSs.M11, M21, M1j and M2j. Although the basic structure of the sense amplifier with the outputs of the bus lines B and BB through this digit switch is similar to that of the first embodiment, an nMOS.M91 is connected between the common source terminal of M3 and M4 that are pMOSs of the latch circuit and VCC, and the control signal SE2 is inputted to the gate thereof. Since the high potential raised by this pMOS latch is also lowered by the threshold value portion of the nMOS.M91, such potential of the bus lines B and BB or the signal lines S and SB that raises the digit lines D and DB so as to produce offset does no longer exist. A buffer circuit with the signal lines S and SB as an input is a CMOS logic obtained by connecting pullup to VCC. However, being gate terminal input, a logic signal up to VCC or GND is obtainable at the output terminal. What is required to pay attention in this circuit is that the gate voltage cannot be made sufficiently high because the digit line switch element is an NMOS, and impedance is high. In particular, since the impedance shows a tendency of increasing when the potential of the bus lines B and BB is lowered, the transistor capability is changed in a reverse direction against the difference current at the time of sense amplifier operation. Since this action works in the direction of negating the amplifier effects by means of transfer elements, it is required to make it difficult to see from the signal lines S and SB. In other words, the node capacity of the bus lines B and BB is made comparatively large against the capacity of the signal lines S and SB so as to make the voltage change of the bus lines B and BB difficult to occur, but it becomes an optimum structure also to make the capacity of the bus lines B and BB low against the digit line capacity at the same time so that large delay is not produced in the delay time from the digit lines D and DB.

Figure 9:
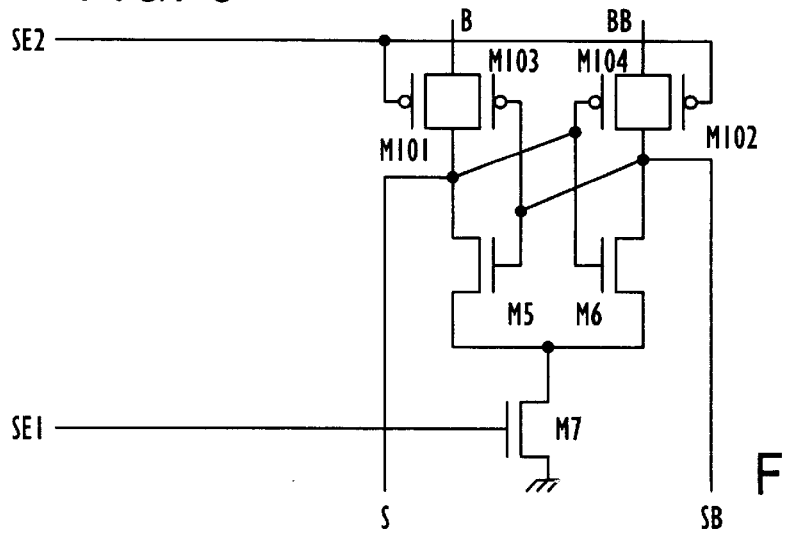
FIG. 9 is a circuit diagram of a sense amplifier according to a seventh embodiment of the present invention.

FIG. 9 is a circuit diagram of a sense amplifier according to a seventh embodiment of the present invention. In the examples shown up to this point, achievement of a high speed has been aimed at by realizing the improvement of the sense amplifier capability with the combination of the transfer elements and the nMOS differential amplifier circuit, but such an operation that the control signal SE2 is brought to a high level and applied with latch after the above, thereby to generate output voltage is performed thereafter. An example in which capability expansion is aimed at the ON time of the latch circuit is shown. Source terminals of M103 and M104 that are PMOS circuits for latching are connected to bus lines B and BB, respectively. The operation is described with reference to a case that the precharging potential of the digit line is VCC, but the operation shows almost no difference in the case of the VCC-nMOS threshold value. The control signal SE1 becomes high, and falls while the potential difference between the signal lines S and SB is increasing, and the control signal SE2 becomes high thereafter so as to turn the latch circuit of the pMOS ON. A high-speed operation becomes possible if there were no malfunction in the pMOS latch circuit which is turned ON even when the potential difference between the signals S and SB when the control signal SE2 is turned ON is comparatively small. Therefore, the bus lines B and BB are connected to the source-terminal in order to make the gate voltage difference larger in this latch circuits too. Since the potential difference between the bus lines B and BB is added as the gate voltage difference in addition to the potential difference between signals S and SB in another embodiment, it is effective to the stability of high-speed latch operation of the control signal SE2 and thereafter.

Figure 10:
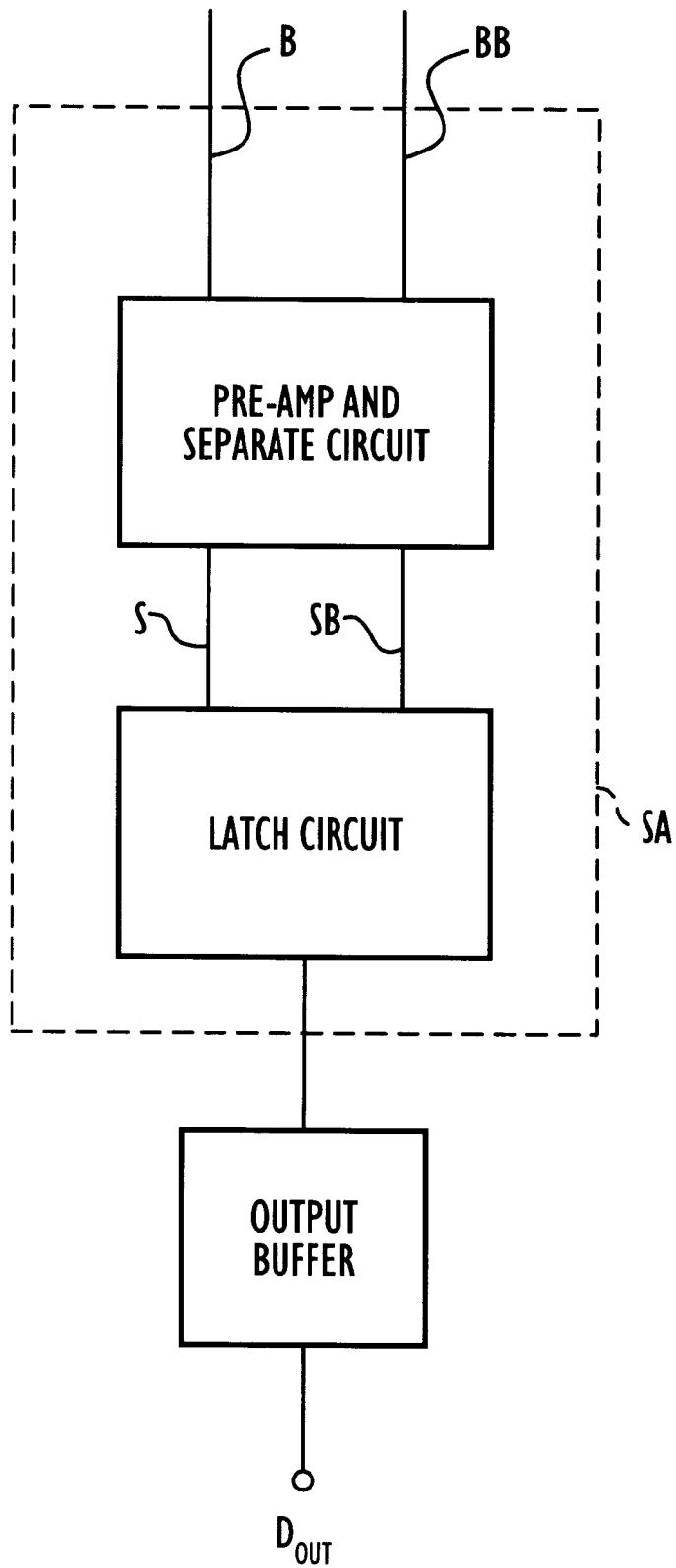
FIG. 10 is a block diagram showing the circuit of the present invention.
Figure 11:
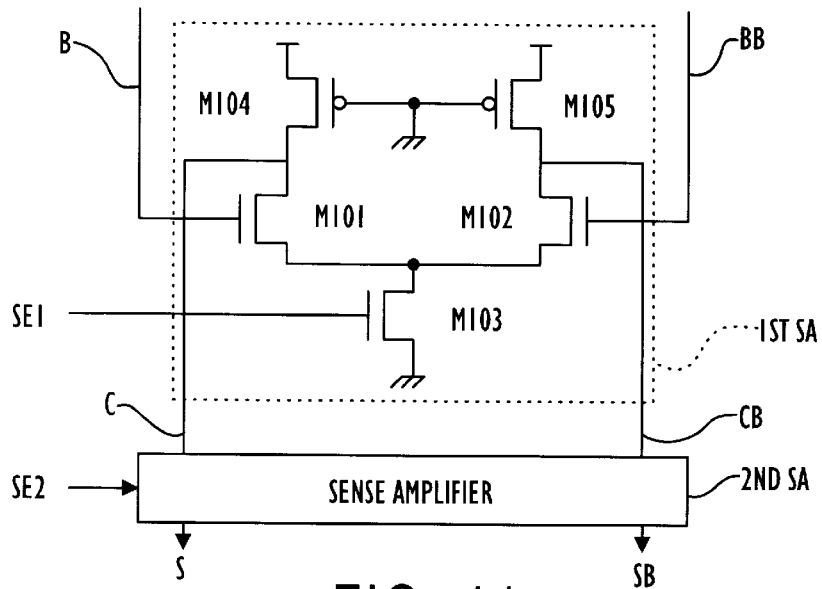
FIG. 11 is a circuit diagram of a sense amplifier showing a first conventional example.
Figure 12:
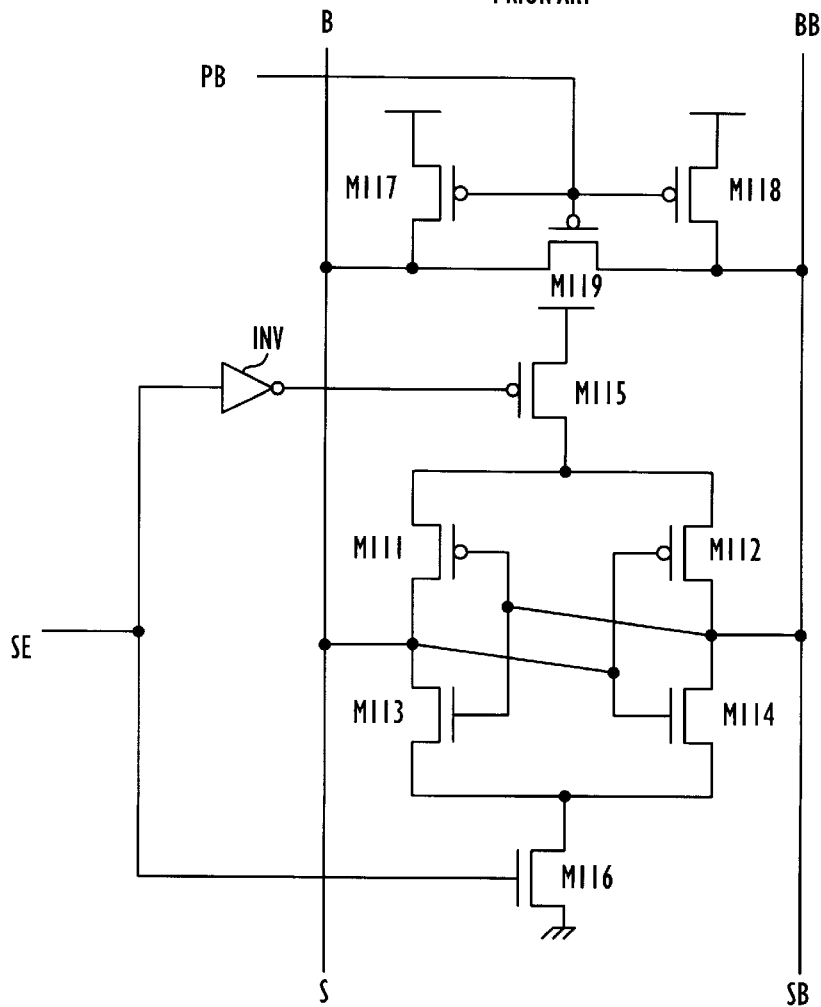
FIG. 12 is a circuit diagram of a sense amplifier showing a second conventional example.

The present invention can be shown by a block diagram showed FIG. 10.

A sense amplifier circuit has a latch circuit and a pre-amplifier/separate circuit. a bus lines pair is connected to the pre-amplifier/separate circuit. The pre-amplifier/separate circuit is connected to a signal lines pair. The signal lines pair is connected to the latch circuit. When the pre-amplifier/separate circuit is not activated, the data on the bus lines pair is transferred to the signal lines pair so that the voltage difference on the signal lines pair becomes larger than the voltage difference on the bus lines pair according to the data. That is, the data is amplified by the preamplifier/separate circuit. The pre-amplifier/separate circuit separates the bus lines pair and the signal lines pair. Thereafter, the latch circuit latches the data on the signal lines pair with amplifying the data on the signal lines pair. As the concept, since the data on the signal lines pair is amplified by the pre-amplifier/separate circuit, the latch circuit can get the data quicly and relaibility. Moreover, the capacity of the bus lines pair is separated from the latch circuit due to the pre-amplifier/separate circuit.

As described above, according to the present invention, in the case of a circuit structure for amplifying up to a logical level with only one stage having feedback function of a latch system the number of stages of the amplifying stage of the sense amplifier circuit, a transfer element of a pMOS transistor is provided on this side of the gate input terminal of an NMOS differential amplifier of a latch system, and the transfer element is turned OFF when the gate voltage difference of the nMOS forming a differential amplifier is widened sufficiently after the nMOS differential amplifier is turned ON. Further, since amplification is completed at one stage by connecting the pMOS differential amplifier of the latch system in parallel, the amplification effect of the sense amplifier is increased, and, when two to three times strong capability dispersion is added to the unbalance between pair transistors forming the sense amplifier, circuit operation in which the rate of dispersion quantity (%) that is subjected to almost no influence thereof becomes larger two to three times can be realized, and large reduction of the number of circuit elements becomes possible since a sense amplifier on one stage only can be realized easily.

It is apparent that the present invention is not limited to the above embodiments but may be modified and changed without departing from the scope and spirit of the invention.

What is claimed is:

1. An amplifier circuit comprising:

first and second signal lines between which a potential difference representative of a data to be amplified appears;

first and second nodes;

a latch circuit coupled between said first and second nodes and, when activated, amplifying a voltage difference between said first and second nodes;

a first transistor coupled between said first signal line and said first node; and a second transistor coupled between said second signal line and said second node;

said first and second transistors being rendered conductive to transfer said potential difference to said first and second nodes and rendered non-conductive after said latch circuit is activated to be allowed to amplify said potential difference transferring between said first and second nodes.

2. The circuit as claimed in claim 1, wherein said first and second transistors are P-channel MOS type.

3. The circuit as claimed in claim 1, further comprising, eighth and ninth transistors connected in series, a first buffer coupled between said first node and a gate of said eighth transistor, and a second buffer coupled between said second node and a gate of said ninth transistor.

4. The circuit as claimed in claim 1, wherein said latch circuit is activated when a first control signal is a first level and said first and second nodes are precharged when said first control signal is a second level.

5. The circuit as claimed in claim 1, wherein said latch circuit is controlled by a first control signal and said first and second transistors are controlled by a second control signal different from said first control signal.

6. The circuit as claimed in claim 5, wherein said latch circuit comprises a third transistor of a first channel type having a first gate coupled to said second node, a fourth transistor of said first channel type having a second gate coupled to said first node, a fifth transistor of a second channel type coupled between a third node and said first node and having a third gate connected to said second node, a sixth transistor of said second channel type coupled between said third node and said second node and having a fourth gate connected to said first node, and a seventh transistor coupled between said third node and a power source line and having a fifth gate receiving said first control signal.

7. The circuit as claimed in claim 6, wherein said third transistor coupled between said first node and a fourth node and said fourth transistor coupled between said second node and said fourth node, and said second control signal is provided to said fourth node.

8. A semiconductor memory comprising:
a memory cell storing data;
a data line pair for transferring a potential difference indicative of said data read out of said memory cell;
a bus line pair;
a first transistor pair coupled between said data line pair and said bus line pair, respectively; and
an amplifier circuit comprising first and second nodes, a latch circuit coupled between said first and second nodes, and, when activated, amplifying a voltage differences between said first and second nodes, and a second transistor pair controlling connection between said first and second nodes and said bus line pair, respectively;
said second transistor pair being turned ON to allow said potential difference to appear between said first and second nodes through said fist transistor pair and said bus line pair while said latch circuit is being deactivated and turned OFF after said latch circuit is activated.

9. The memory as claimed in claim 8, wherein said first transistor pair and said second transistor pair are p-channel MOS type.

10. The memory as claimed in claim 8, wherein said latch circuit is activated before said bus line pair is disconnected from said first and second nodes.

11. The memory as claimed in claim 8, wherein said second transistor pair is controlled by a first control signal and said latch circuit is controlled by a second control signal different form said first control signal.

12. The memory as claimed in claim 11, wherein said first transistor pair is n-channel MOS type, said second transistor pair is p-channel MOS type, and said amplifier circuit further comprises a first n-channel transistor for transferring a first power voltage to said latch circuit corresponding to said first control signal and a second n-channel transistor for transferring a second power voltage to said latch circuit corresponding to said second control signal.

13. The memory as claimed in claim 8, wherein said amplifier circuit comprises a first inverter circuit having a first input terminal connected to said first node and a first output terminal, a first MOS transistor having a first gate coupled to said first output terminal, a second inverter circuit having a second input terminal connected to said second node and a second output terminal, a third inverter circuit having a third input terminal connected to said second output terminal and a third output terminal, a second MOS transistor having a second gate connected to said third output terminal, and a read line coupled between said first and second MOS transistors.

14. The memory as claimed in claim 13, wherein said first output terminal is connected to one transistor of said second transistor pair and said second output terminal is connected to the another transistor of said second transistor pair.

15. An amplifier circuit comprising:
a bus lines pair;
a latch circuit; and
means for pre-amplifying data on said bus lines pair when said data transfers to said latch circuit, activating said latch circuit in response to a first control signal and separating said bus lines pair from said latch circuit in response to a second control signal which is different from said first control signal after said latch circuit is activated, in read operation.

16. An amplifier circuit comprising:
first and second bus lines,
first and second signal lines,
a node,
a first power source line,
a first transistor of a first type coupled between said first bus line and said first signal line, and having a first gate electrode supplied with a first control signal,
a second transistor of said first type coupled between said second bus line and said second signal line, and having a second gate electrode supplied with said first control signal,
a third transistor of said first type having a third gate electrode coupled to said second signal line, a first electrode supplied with said first control signal, and second electrode coupled to said first signal line,
a fourth transistor of said first type having a fourth gate electrode coupled to said first signal line, a third electrode supplied with said first control signal, and a fourth electrode coupled to said second signal line,
a fifth transistor of a second type coupled between said first signal line and said node, and having a fifth gate electrode coupled to said second signal line,
a sixth transistor of said second type coupled between second signal line and said node, and having a sixth gate electrode coupled to said first signal line, and
a seventh transistor of said second type coupled between said first power source line and said node, and having a seventh gate electrode supplied with a second signal.

17. The circuit as claimed in claim 16, said amplifier circuit further comprising:
a second power source line, a read line, a first buffer having a first input terminal coupled to said second signal line and a first output terminal, a second buffer having a second input terminal coupled to said first signal line and a second output terminal, a eighth transistor of said first type coupled between said second power source line and said read line, and having a eight electrode coupled to said first output terminal of said first buffer, and a ninth transistor of said second type coupled between said first power source line and said read line, and having a ninth electrode coupled to said second output terminal of said second buffer.

18. The circuit as claimed in claim 16, said amplifier circuit further comprising, a first circuit for pre-charging said first and second bus lines to equalize a voltage level of said first and second bus lines, and a second circuit for pre-charging said first and second signal lines to equalize a voltage level of said first and second signal lines.

19. The circuit as claimed in claim 18, wherein said first circuit has a eighth transistor connected between said first and second bus lines, having a eighth gate supplied with a first charge signal, a ninth transistor connected between a second power source line and said first bus line, and having a ninth gate supplied with said first charge signal, and a tenth transistor connected between said second power source line and said second bus line, and having a tenth gate supplied with said first charge signal, said second circuit has a eleventh transistor connected between said first and second signal lines, having a eleventh gate supplied with a second charge signal, a twelfth transistor connected between said second power source line and said second bus line, and having a twelfth gate supplied with said first charge signal, and a thirteenth transistor connected between said second power source line and said second signal line, and having a thirteenth gate supplied with said second charge signal.

20. An amplifier circuit comprising:

first and second bus lines;

first and second signal lines;

a node;

first and second power source lines;

a first transistor of a first type coupled between said first bus line and said first signal line, and having a first gate electrode supplied with a first control signal;

a second transistor of said first type coupled between said second bus line and said second signal line, and having a second gate electrode supplied with said first control signal;

a third transistor of said first type coupled between said first signal line and said first power source line, and having a third gate electrode coupled to said second signal line;

a fourth transistor of said first type coupled between said second signal line and said first power source line, and having a fourth gate electrode coupled to said first signal line;

a fifth transistor of a second type coupled between said first signal line and said node, and having a fifth gate electrode coupled to said second signal line;

a sixth transistor of said second type coupled between said second signal line and said node, and having a sixth gate electrode coupled to said first signal line;

a seventh transistor of said second type coupled between said second power source line and said node, and having a seventh gate electrode coupled to said second control signal;

said first and second transistors being ON in response to a first state of said first control signal and said seventh transistor being OFF in response to a first state of said second control signal at a first period, said first and second transistors being ON in response to said first state of said first control signal and said seventh transistor being turned ON in response to a second state of said second control signal at a second period after said first period, said first and second transistors being OFF in response to a second state of said first control signal and said seventh transistor being turned ON in response to said second state of said second control signal at a third period after said second period.

21. An amplifier circuit comprising, first and second bus lines, first and second signal lines, a node, first and second power source lines, a first transistor of a first type coupled between said first bus line and said first signal line, and having a first gate electrode, a second transistor of said first type coupled between said second bus line and said second signal line, and having a second gate electrode, a third transistor of said first type coupled between said first signal line and said first power source line, and having a third gate electrode coupled to said second signal line, a fourth transistor of said first type coupled between said second signal line and said first power source line, and having a fourth gate electrode coupled to said first signal line, a fifth transistor of a second type coupled between said first signal line and said node, and having a fifth gate electrode coupled to said second signal line, a sixth transistor of said second type coupled between said second signal line and said node, and having a sixth gate electrode coupled to said first signal line, a seventh transistor of said second type coupled between said second power source line and said node, and having a seventh gate electrode supplied with a first control signal, a pre-charge circuit for rising voltage levels of said first and second signal lines in response to a second control signal, a first inverter circuit having a first input terminal connected to said first signal line and a second output terminal connected to said first gate of said first transistor, and a second inverter circuit having a second input terminal connected to said second signal line and a second output terminal connected to said second gate of said first transistor.

22. An amplifier circuit comprising:

first and second data lines, first and second signal lines, a node, a first power source line, a first transistor of a first type coupled between said first data line and said first signal line, and having a first gate electrode supplied with a first select signal, a second transistor of said first type coupled between said second data line and said second signal line, and having a second gate electrode supplied with said first select signal, a third transistor of said first type having a third gate electrode coupled to said second signal line, a first electrode connected to said first signal line, and a second electrode supplied with a first control signal, a fourth transistor of said first type having a fourth gate electrode coupled to said first signal line, a third electrode connected to said second signal line, and a fourth electrode supplied with said first control signal, a fifth transistor of a second type coupled between said first signal line and said node, and having a fifth gate electrode coupled to said second signal line, a sixth transistor of said second type coupled between said second signal line and said node, and having a sixth gate electrode coupled to said first signal line, and a seventh transistor of said second type coupled between said second power source line and said node, and having a seventh gate electrode supplied with a second control signal, and a gate circuit responding to a second select signal and said first control signal to produce said first select signal.

23. An amplifier circuit comprising, first and second bus lines, first and second signal lines, first and second nodes, first and second power source lines, a first transistor of a first type coupled between said first bus line and said first signal line, and having a first gate electrode supplied with a first control signal, a second transistor of said first type coupled between said second bus line and said second signal line, and having a second gate electrode supplied with said first control signal, a third transistor of said first type coupled between said first signal line and said second node, and having a third gate electrode coupled to said second signal line, a fourth transistor of said first type coupled between said second signal line and said second node, and having a fourth gate electrode coupled to said first signal line, a fifth transistor of a second type coupled between said first signal line and said first node, and having a fifth gate electrode coupled to said second signal line, a sixth transistor of said second type coupled between said second signal line and said first node, and having a sixth gate electrode coupled to said first signal line, a seventh transistor of said second type coupled between said second power source line and said first node, and having a seventh gate electrode supplied with a second signal, and a eighth transistor of said second type coupled between said first power source line and said second node, and having a eighth gate electrode supplied with said first control signal.

24. An amplifier circuit comprising, first and second bus lines, first and second signal lines, a node, a power source line, a first transistor of a first type coupled between said first bus line and said first signal line, and having a first gate electrode supplied with a first control signal, a second transistor of said first type coupled between said second bus line and said second signal line, and having a second gate electrode supplied with said first control signal, a third transistor of said first type coupled between said first bus line and said first signal line and parallel with said first transistor, said third transistor having a third gate electrode coupled to said second signal line, a fourth transistor of said first type coupled between said second bus line and said second signal line and parallel with said second transistor, said fourth transistor having a fourth gate electrode coupled to said first signal line, a fifth transistor of a second type coupled between said first signal line and said node, and having a fifth gate electrode coupled to said second signal line, a sixth transistor of said second type coupled between said second signal line and said node, and having a sixth gate electrode coupled to said first signal line, and a seventh transistor of said second type coupled between said second power source line and said node, and having a seventh gate electrode supplied with a second control signal.

25. An amplifier circuit comprising:

bus line pair;

a latch circuit; and a pre-amplifier and separate circuit connected to said bus line pair and said latch circuit;

wherein said pre-amplifier and separate circuit amplifies data on said bus line pair when said data transfers to said latch circuit and separates said bus line pair and said latch circuit after said latch circuit is activated in read operation.

* * * * *